US012614605B2

(12) United States Patent
Jhaveri et al.

(10) Patent No.: US 12,614,605 B2
(45) Date of Patent: Apr. 28, 2026

(54) SEQUENTIAL ACCESS TO LINKED MEMORY DICE FOR BUS TRAINING

(71) Applicant: Micron Technology, Inc., Boise, ID (US)

(72) Inventors: Smruti Subhash Jhaveri, Boise, ID (US); Hyunyoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 18/651,357

(22) Filed: Apr. 30, 2024

(65) Prior Publication Data

US 2024/0371460 A1      Nov. 7, 2024

Related U.S. Application Data

(60) Provisional application No. 63/463,342, filed on May 2, 2023.

(51) Int. Cl.
*G11C 29/56*            (2006.01)
(52) U.S. Cl.
CPC .. *G11C 29/56004* (2013.01); *G11C 29/56016* (2013.01); *G11C 2029/5602* (2013.01)
(58) Field of Classification Search
CPC ........ G11C 29/56004; G11C 29/56016; G11C 2029/5602
See application file for complete search history.

(56) References Cited

U.S. PATENT DOCUMENTS

| | | | |
|---|---|---|---|
| 7,277,350 B2 | 10/2007 | Huckaby et al. | |
| 9,881,664 B1 | 1/2018 | Ying et al. | |
| 10,996,885 B2 | 5/2021 | Lee et al. | |
| 11,869,626 B2 | 1/2024 | Kim et al. | |
| 11,948,660 B2 | 4/2024 | Wieduwilt et al. | |
| 2002/0167855 A1 | 11/2002 | Hsu et al. | |
| 2009/0196093 A1* | 8/2009 | Happ ................. | G11C 13/0023 |
| | | | 438/102 |
| 2010/0091537 A1 | 4/2010 | Best et al. | |
| 2011/0006835 A1 | 1/2011 | Kim et al. | |
| 2013/0336039 A1* | 12/2013 | Frans ....................... | G11C 5/02 |
| | | | 365/51 |
| 2014/0185352 A1 | 7/2014 | Chow et al. | |
| 2014/0252640 A1 | 9/2014 | Kwak | |
| 2017/0364469 A1 | 12/2017 | Crisp | |
| 2020/0075548 A1 | 3/2020 | Kim et al. | |
| 2020/0176047 A1 | 6/2020 | Meier et al. | |
| 2020/0219555 A1 | 7/2020 | Rehmeyer | |
| 2020/0388324 A1 | 12/2020 | Rehmeyer et al. | |
| 2021/0005244 A1 | 1/2021 | Hiscock et al. | |
| 2021/0110855 A1* | 4/2021 | Johnson .............. | G11C 11/4087 |
| 2021/0200464 A1 | 7/2021 | Keeth | |
| 2022/0100420 A1 | 3/2022 | Johnson | |

* cited by examiner

*Primary Examiner* — Mohammed A Bashar
(74) *Attorney, Agent, or Firm* — Brooks, Cameron & Huebsch, PLLC

(57)                    ABSTRACT

During a command bus training (CBT), interconnected memory dice are accessed in a sequence determined (e.g., predetermined) by a bit sequence generator and via a shared data link for retrieving a respective set of feedback data of the CBT from each memory dice. This eliminates a need to individually train and/or control interconnected memory dice for the CBT; thereby, providing a flexible and scalable architecture that can accommodate a range of memory densities (e.g., a number of memory dice that are interconnected) and making it a valuable solution for high-performance memory applications.

19 Claims, 11 Drawing Sheets

350

START MEMORY DEVICE ⟩ —351

INITIALIZE: RANDOMIZE DATA WITHIN RANK
WITH CONTROL LOGIC FROM
1. PRBS
2. DIE ID
—352

READ FROM CA (A) —353

DATA TO SUB PAD (B) —354

IS
CHOSEN DATA A SLAVE
DIE? —355
NO

YES

TRANSFER DATA TO MASTER DIE SUB PAD
USING WIRE BONDING (B1) —356

DATA TO MASTER DIE MAIN PAD (C)
—357

OUTPUT TO DQ (D) ⟩ —358

*570*

START MEMORY DEVICE — *571*

INITIALIZE: RANDOMIZE DATA WITHIN RANK
WITH CONTROL LOGIC FROM
1. PRBS
2. DIE ID — *572*

GET DATA FROM DQ PAD (A) — *573*

DATA FROM MASTER MAIN PAD
TO SUB PAD (B) — *574*

IS
CHOSEN DIE A SLAVE
DIE? — *575*

NO

YES

TRANSFER DATA TO SLAVE DIE SUB PAD
USING WIRE BONDING (B1) — *576*

WRITE TO VrefCA (C)

*577*

SEQUENTIAL ACCESS TO LINKED MEMORY DICE FOR BUS TRAINING

PRIORITY INFORMATION

This application claims the benefit of U.S. Provisional Application No. 63/463,342 filed on May 2, 2023, the contents of which are incorporated herein by reference.

TECHNICAL FIELD

The present disclosure relates generally to semiconductor memory and methods, and more particularly, to apparatuses, systems, and methods for sequential access to linked memory dice for bus training.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Figure 1:
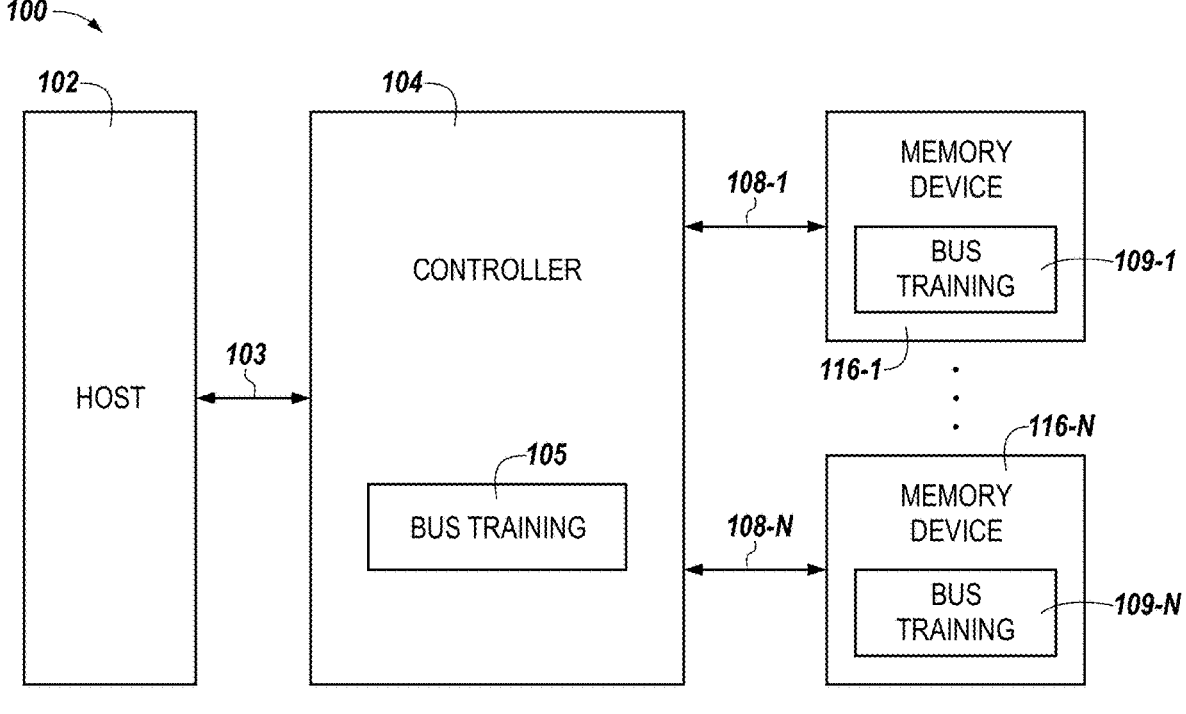
FIG. 1 is a block diagram of a computing system in accordance with a number of embodiments of the present disclosure.

Systems, apparatuses, and methods related to sequential access to linked memory dice for bus training are described. In some previous approaches to stacked memory dice, the signaling for data transfer and/or command/address (CA) signaling was arranged such that each memory die can be controlled independently by the control circuitry by direct communication of signals between the control circuitry and each memory die. In some other approaches to stacked memory dice, the signaling can be routed via through-silicon vias (TSVs) to each memory die and a control die (e.g., for a hybrid memory cube). In some approaches, a primary memory die/secondary memory die communication protocol (sometimes referred to in the art as master/slave) is used to communicate with control circuitry and/or a host. However, such approaches involve a significant quantity of internal control signals for the memory dice, which can make it difficult to achieve increased density for stacked memory dice (e.g., due to the circuit complexity of the stacked memory dice configurations).

Aspects of the present disclosure address the above and other challenges for memory systems including stacked memory dice. For example, while memory dice are internally connected to one another, some memory dice can be externally connected to the substrate. The memory dice that are connected externally can act as interface dice for other memory dice that are connected internally thereto. In some embodiments, the external connections are used for transmitting signals indicative of data to and/or from the memory dice while the memory dice are internally connected by a cascading connection for transmission of other signals such as command, address, power, ground, etc.

Data access to the linked memory dice can be randomized by accessing the memory dice in a sequence, which can be predetermined, for example. In some embodiments, the linked memory dice can be coupled to one shared command/address (CA) bus, which can be used to send the same command to all the memory dice. The memory dice can determine a sequence for the outputting (e.g., sending) of data from each memory die once a command is received. This data can be transmitted according to the sequence, either directly from the interface die (if the data was stored in an array of memory cells on the interface die) or indirectly from another one of the non-interface memory dice to the interface die (if the data was stored in an array of memory cells on the non-interface memory die). An example procedure that access linked memory dice together in the determined sequence can include a bus training, such as a command bus training (CBT). As used herein, the term "bus training" refers to a procedure of establishing a timing parameter for correctly receiving signaling over a bus. Further, as used herein the term "CBT" or "command bus training" refers to a bus training operation performed on a command bus.

The embodiments of the present disclosure provide control over linked memory dice (e.g., determining a sequence, in which the memory dice are accessed) via a shared CA bus, which reduces complexity and improves efficiency while allowing for higher density architectures. As used herein, an interface die that is externally connected to a substrate can be referred to as "primary memory die" and the other memory dice that are not an interface die can be referred to as "secondary memory die".

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 720 may reference element "20" in FIG. 7, and a similar element may be referenced as 820 in FIG. 8.

Analogous elements within a Figure may be referenced with a hyphen and extra numeral or letter. See, for example, elements 116-1, . . . , 116-N in FIG. 1. Such analogous elements may be generally referenced without the hyphen and extra numeral or letter. For example, elements 116-1, . . . , 116-N may be collectively referenced as 116. As used herein, the designators "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of a computing system 100 in accordance with a number of embodiments of the present disclosure. The computing system 100 includes a host 102, a controller 106, and memory devices 116-1, . . . , 116-N, which might also be separately considered an "apparatus."

The host 102 can include host memory and a central processing unit (not illustrated). The host 102 can be a host system such as a personal laptop computer, a desktop computer, a digital camera, a smart phone, a memory card reader, and/or internet-of-thing enabled device, among various other types of hosts, and can include a memory access device (e.g., a processor and/or processing device). One of ordinary skill in the art will appreciate that "a processor" can intend one or more processors, such as a parallel processing system, a number of coprocessors, etc.

The host 102 can include a system motherboard and/or backplane and can include a number of processing resources (e.g., one or more processors, microprocessors, or some other type of controlling circuitry). The system 100 can include separate integrated circuits or the host 102, the memory controller 104, and the memory devices 116 can be on the same integrated circuit. The system 100 can be, for instance, a server system and/or a high-performance computing (HPC) system and/or a portion thereof.

As illustrated in FIG. 1, a host 102 can be coupled to the controller 106 via an interface 103. The interface 103 can be any type of communication path, bus, or the like that allows for information to be transferred between the host 102 and the controller 106. Non-limiting examples of interfaces can include a peripheral component interconnect (PCI) interface, a peripheral component interconnect express (PCIe) interface, a serial advanced technology attachment (SATA) interface, and/or a miniature serial advanced technology attachment (mSATA) interface, among others. However, in at least one embodiment, the interface 103 is a PCIe 5.0 interface that is compliant with the compute express link (CXL) protocol standard. Accordingly, in some embodiments, the interface 103 can include a flexible bus interconnect and use CXL protocol layers including CXL.io and CXL.mem and can support transfer speeds of at least 32 gigatransfers per second.

The controller 106 can control performance of a memory operation for an access command received from the host 102. The memory operation can be a memory operation to read data (in response to a read request from the host) from or an operation to write data (in response to a write request from the host) to one or more memory devices 116.

In some embodiments, the controller 106 can be a compute express link (CXL) compliant controller. The host interface (e.g., the front end portion of the controller 106) can be managed with CXL protocols and be coupled to the host 102 via an interface configured for a peripheral component interconnect express (PCIe) protocol. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

The controller 106 can be coupled to the memory devices 116 via channels 108. The channels 108 can include various types data buses, such as a sixteen-pin data bus and a two-pin data mask inversion (DMI) bus, among other possible buses. In some embodiments, the channels 108 can be part of a physical (PHY) layer. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium.

The memory device(s) 116 can provide main memory for the computing system 100 or could be used as additional memory or storage throughout the computing system 100. The memory devices 116 can be various/different types of memory devices. For instance, the memory device can include RAM, ROM, DRAM, SDRAM, PCRAM, RRAM, and flash memory, among others. In embodiments in which the memory device 116 includes persistent or non-volatile memory, the memory device 116 can be flash memory devices such as NAND or NOR flash memory devices. Embodiments are not so limited, however, and the memory device 116 can include other non-volatile memory devices such as non-volatile random-access memory devices (e.g., non-volatile RAM (NVRAM), ReRAM, ferroelectric RAM (FeRAM), MRAM, PCRAM), "emerging" memory devices such as a ferroelectric RAM device that includes ferroelectric capacitors that can exhibit hysteresis characteristics, a memory device with resistive, phase-change, or similar memory cells, etc., or combinations thereof.

As an example, a FeRAM device can include ferroelectric capacitors and can perform bit storage based on an amount of voltage or charge applied thereto. In such examples, relatively small and relatively large voltages allow the ferroelectric RAM device to exhibit characteristics similar to normal dielectric materials (e.g., dielectric materials that have a relatively high dielectric constant) but at various voltages between such relatively small and large voltages the ferroelectric RAM device can exhibit a polarization reversal that yields non-linear dielectric behavior.

As another example, an array of non-volatile memory cells, such as resistive, phase-change, or similar memory cells, can perform bit storage based on a change of bulk resistance, in conjunction with a stackable cross-gridded data access array. Additionally, in contrast to many flash-based memories, the non-volatile memory can perform a write in-place operation, where a non-volatile memory cell can be programmed without the non-volatile memory cell being previously erased.

One example of memory devices 116 is dynamic random access memory (DRAM) operated according to a protocol such as low-power double data rate (LPDDRx), which may be referred to herein as LPDDRx DRAM devices, LPDDRx memory, etc. The "x" in LPDDRx refers to any of a number of generations of the protocol (e.g., LPDDR5). In at least one embodiment, at least one of the memory devices 116-1 is operated as an LPDDRx DRAM device with low-power features enabled and at least one of the memory devices 116-N is operated an LPDDRx DRAM device with at least one low-power feature disabled. In some embodiments, although the memory devices 116 are LPDDRx memory devices, the memory devices 116 do not include circuitry configured to provide low-power functionality for the memory devices 116 such as a dynamic voltage frequency scaling core (DVFSC), a sub-threshold current reduce circuit (SCRC), or other low-power functionality providing circuitry. Providing the LPDDRx memory devices 116 without such circuitry can advantageously reduce the cost, size, and/or complexity of the LPDDRx memory devices 116. By way of example, an LPDDRx memory device 116 with reduced low-power functionality providing circuitry can be used for applications other than mobile applications (e.g., if the memory is not intended to be used in a mobile application, some or all low-power functionality may be sacrificed for a reduction in the cost of producing the memory).

Figures 2A, 2B:
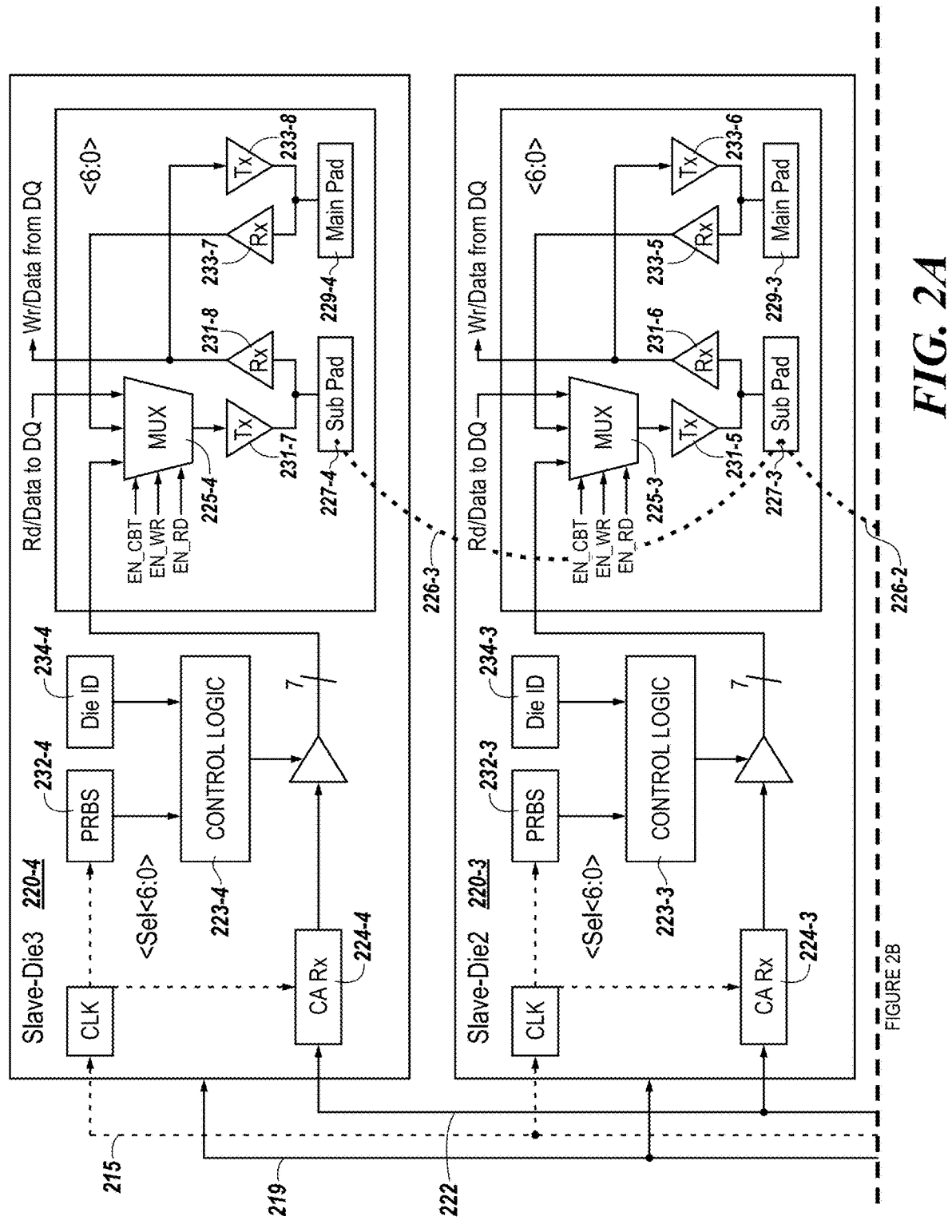
FIGS. 2A and 2B illustrate a block diagram of a link architecture between linked memory dice in accordance with a number of embodiments of the present disclosure.
Figure 2B:
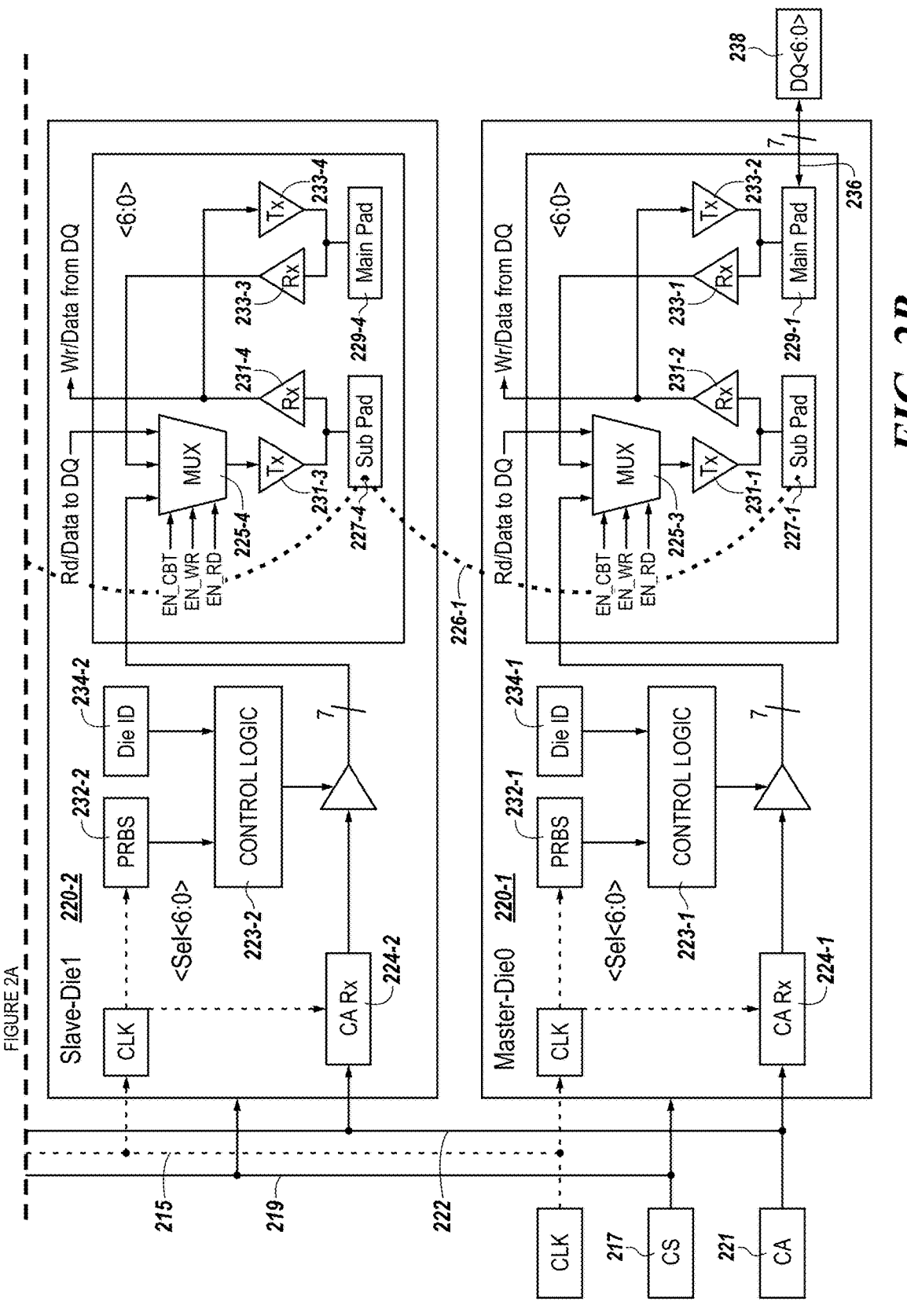

The memory devices 116 can each comprise a number of memory dice (e.g., memory dice 220-1, . . . , 220-4 illustrated in FIGS. 2A and 2B). These memory dice can be linked memory dice. As further illustrated in connection with FIGS. 2A and 2B, while memory dice are internally connected, some memory dice can be connected externally to the substrate (e.g., package substrate 713 and/or 813 illustrated in FIGS. 7 and 8) to act as interface dice for other memory dice that are connected internally thereto. In some embodiments, these linked memory dice can be "stacked" memory dice.

The controller 106 can further include a bus training component 105. Although not shown in FIG. 1 so as to not obfuscate the drawings, the bus training component 105 can include various circuitry to facilitate performance of operations described herein. For example, the bus training component 105 can perform those operations associated with a bus training. As used herein, the term "bus training" refers to a procedure of establishing a timing parameter for correctly receiving signaling over a bus. Further, a bus training operation performed on a command bus (e.g., a CA bus 222 illustrated in FIGS. 2A and 2B) can be referred to as a command bus training (CBT).

The bus training component 105 can initiate a bus training (alternatively referred to as "bus training operation", "bus training procedure", etc.) by issuing commands (e.g., mode register write commands) to the memory devices 116 and subsequently sending (e.g., transmit) a test pattern (alternatively referred to as "test data pattern") over a bus (e.g., a CA bus 222), to one or more memory devices 116. The test pattern can be received at memory dice (e.g., corresponding to one or more ranks) of the memory device 116 according to a first timing parameter. Upon receipt, each memory die can return (e.g., send) the received test pattern (alternatively referred to as "feedback pattern") back to the controller 106. If the feedback pattern matches the test pattern as sent from controller 106, the controller 106 can instruct the memory device 116 to lock in the first timing parameter for receiving on the command bus. On the other hand, if the patterns do not match, controller 106 can repeat the testing and feedback process with the memory device using a different, second timing parameter and one or more test patterns. The bus training operation can continue until a suitable timing parameter is ascertained.

The memory device 116 includes a bus training circuit 109 (e.g., a bus training circuit 109-1 in the memory device 116-1 and a bus training circuit 109-N in the memory device 116-N), which can coordinate bus training procedure to be performed/performed on linked memory dice of each memory device 116. For example, while the test pattern may be substantially simultaneously received at memory dice of the memory device 116, the feedback pattern can be output (e.g., sent) from linked memory dice (e.g., linked memory dice 220-1, . . . , 220-4) in a particular sequence, which can be determined by the bus training circuit 109. As used herein, the term "output" can be interchangeably used with other terms such as "transfer", and "send". The bus training circuit 109 can include one or more bit sequence generators (e.g., bit sequence generators 232-1, . . . , 232-4 illustrated in FIGS. 2A and 2B) on memory dice to randomize a sequence in which data are output from the memory dice. The bit sequence generators can be, for example, pseudo random bit sequence (PRBS) generators.

As used herein, the term "substantially" means that the characteristic need not be absolute, but is close enough so as to achieve the advantages of the characteristic. For example, "substantially simultaneously" is not limited to operations that are performed absolutely simultaneously and can include timings that are intended to be simultaneously but due to manufacturing limitations may not be precisely simultaneously.

FIGS. 2A and 2B illustrate a block diagram of a link architecture between memory dice 220 in accordance with a number of embodiments of the present disclosure. FIGS. 2A and 2B illustrate 4 memory dice 220-1, . . . , 220-4; however, embodiment are not so limited to a particular quantity of memory dice that can be linked (e.g., coupled) together in a similar manner illustrated in FIGS. 2A and 2B. Each memory die (e.g., memory die 220-1, . . . , 220-4) is not illustrated in its entirety in FIGS. 2A and 2B and can further include other portions that are not illustrated in FIGS. 2A and 2B. For example, each memory die 220 can include an array of memory cells where data externally received can be written to or data can be sent from. Although embodiments are not so limited, the memory dice 220-1, . . . , 220-4 can correspond to a rank. As illustrated in FIGS. 2A and 2B, memory dice 220-1, . . . , 220-4 that are linked together can be "stacked" also (e.g., stacked in a vertical manner).

As illustrated in FIGS. 2A and 2B, the memory dice 220-1, . . . , 220-4 are coupled to a chip select (CS) bus 219 that is further coupled to a CS pad 217. Although not illustrated in FIGS. 2A and 2B, the CS pad 217 can be located on a package substrate (e.g., package substrate 713 illustrated in FIG. 7).

Memory dice 220 respectively includes CA signal receivers that are coupled to a (e.g., shared) CA bus 222. As illustrated in FIGS. 2A and 2B, the memory die 220-1 includes a CA signal receiver 224-1 coupled to the CA bus 222; the memory die 220-1 includes a CA signal receiver 224-2 coupled to the CA bus 222; the memory die 220-1 includes a CA signal receiver 224-4 coupled to the CA bus 222; and the memory die 220-1 includes a CA signal receiver 224-4 coupled to the CA bus 222.

Memory dice 220-1, . . . , 220-4 are configured to receive and operate based on a clock signal received via a clock signal bus 215 ("CLK" as shown in FIGS. 2A and 2B). A clock signal can represent a system clock such as a CA clock. For example, a PRBS generator 232 and a CA signal receiver 224 of each memory die 220 can operate based on the clock signal.

Data can be sent among the memory dice 220 by a cascaded wire bonding, such as wire links 226-1, . . . , 226-3 (alternatively referred to as "external wire link"). For example, as illustrated in FIGS. 2A and 2B, data can be sent from the memory die 220-2 to the memory die 220-1 via an wire link 226-1 coupled between sub-pads 227-1 and 227-2; data can be sent from the memory die 220-3 to the memory die 220-2 via an wire link 226-2 coupled between sub-pads 227-2 and 227-3; and data can be sent from the memory die 220-4 to the memory die 220-3 via an wire link 226-3 coupled between sub-pads 227-3 and 227-4.

Data can be sent from the memory dice 220 via an external data bus 236 (e.g., data input/output bus, which is also referred to in the art as a "DQ"), which is coupled to (e.g., the main pad 229-1 of) the memory die 220-1. Although embodiments are not so limited, the external data bus 236 can be 7-bit wide data bus, marked "DQ<6:0>" in FIGS. 2A and 2B.

Each memory die can include respective pairs of transmitter/receiver (e.g., "Tx" and "Rx" as illustrated in FIGS. 2A and 2B) each coupled to a sub-pad 227 and a main pad 229. For example, as illustrated in FIGS. 2A and 2B, the memory die 220-1 includes one pair of transmitter 231-1 and receiver 231-2 coupled to the sub-pad 227-1 and another pair of transmitter 233-1 and receiver 233-2 coupled to the main pad 229-1; the memory die 220-2 includes one pair of transmitter 231-3 and receiver 231-4 coupled to the sub-pad 227-2 and another pair of transmitter 233-3 and receiver 233-4 coupled to the main pad 229-2; the memory die 220-3 includes one pair of transmitter 231-5 and receiver 231-6 coupled to the sub-pad 227-3 and another pair of transmitter 233-5 and receiver 233-6 coupled to the main pad 229-3; and the memory die 220-4 includes one pair of transmitter 231-7 and receiver 231-8 coupled to the sub-pad 227-4 and another pair of transmitter 233-7 and receiver 233-8 coupled to the main pad 229-4.

Memory dice 220-1, . . . 220-4 can respectively include multiplexors 225-1, . . . , 225-4 ("Mux" as shown in FIGS.

2A and 2B and collectively referred to as multiplexors 225). Each multiplexor 225 can be configured to receive a CBT enable signal ("EN_CBT" as shown in FIGS. 2A and 2B), a write enable signal ("EN_WR" as shown in FIGS. 2A and 2B), and a read enable signal ("EN_RD" as shown in FIGS. 2A and 2B). Based on the signal received at multiplexor 225, the multiplexor 225 can select one of inputs shown in FIGS. 2A and 2B and output the selected input to the respective transmitter 231.

Memory dice 220-1, . . . 220-4 respectively include bit sequence generators 232-1, . . . , 232-4, which can be PRBS generators as shown in FIGS. 2A and 2B and control logic 223-1, . . . , 223-4 (collectively referred to as "control logic 223"). Each control logic 223 can be configured to control performance of a memory operation directed to a corresponding memory die 220.

The PRBS generators 232-1, . . . , 232-4 can operate in conjunction with each other (e.g., in response to a command received via the CA bus 222 to determine a sequence at which the linked memory dice 220 are operated and to randomize data input to and/or output from the memory dice 220. In determining a sequence, the PRBS generators 232 can utilize information associated with a unique identifier (ID) assigned to each die ("Die ID" 234 as shown in FIGS. 2A and 2B). Although embodiments are not so limited, the identifier can be ZQID or Fuse ID.

Figure 3:
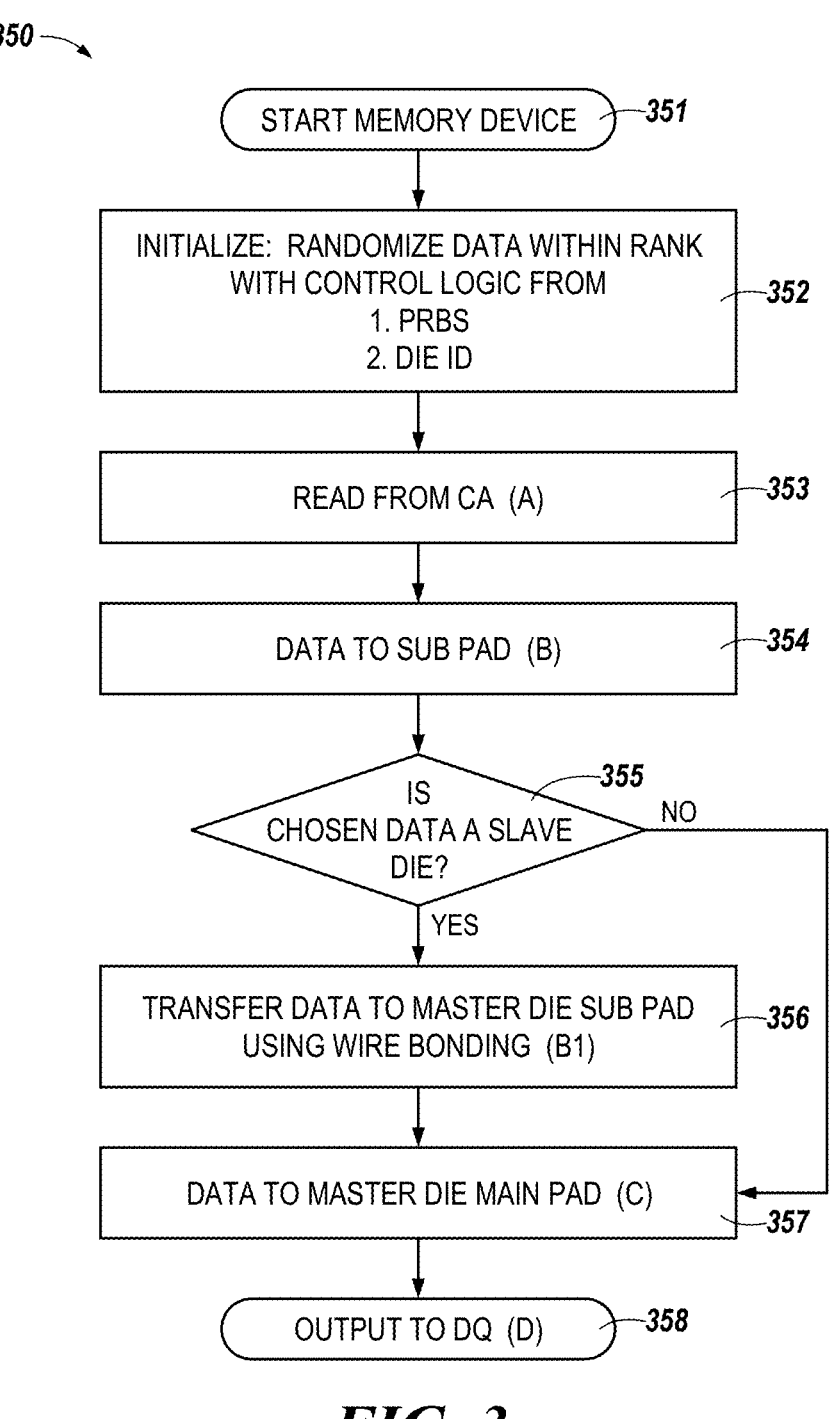
FIG. 3 is a flow diagram that illustrates accessing one of a set of linked memory dice during a bus training in accordance with a number of embodiments of the present disclosure.

FIG. 3 is a flow diagram 350 that illustrates accessing one of linked memory dice (e.g., the memory dice 220 illustrated in FIGS. 2A and 2B) during a bus training (e.g., the bus training illustrated in connection with FIG. 3) in accordance with a number of embodiments of the present disclosure.

Figure 4A:
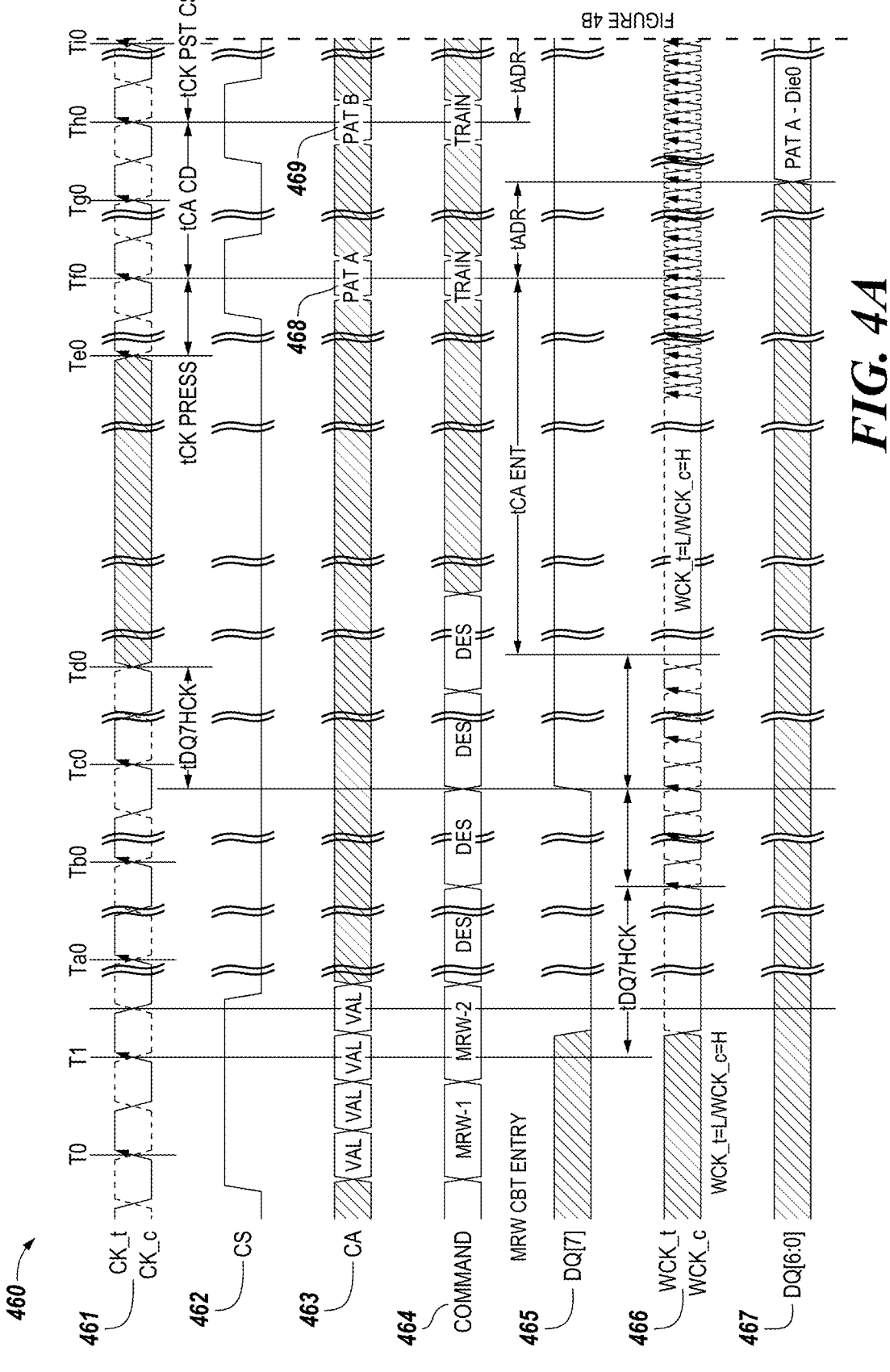
FIGS. 4A and 4B illustrate a timing diagram for accessing one of a set of linked memory dice during an example bus training in accordance with a number of embodiments of the present disclosure.
Figure 4B:
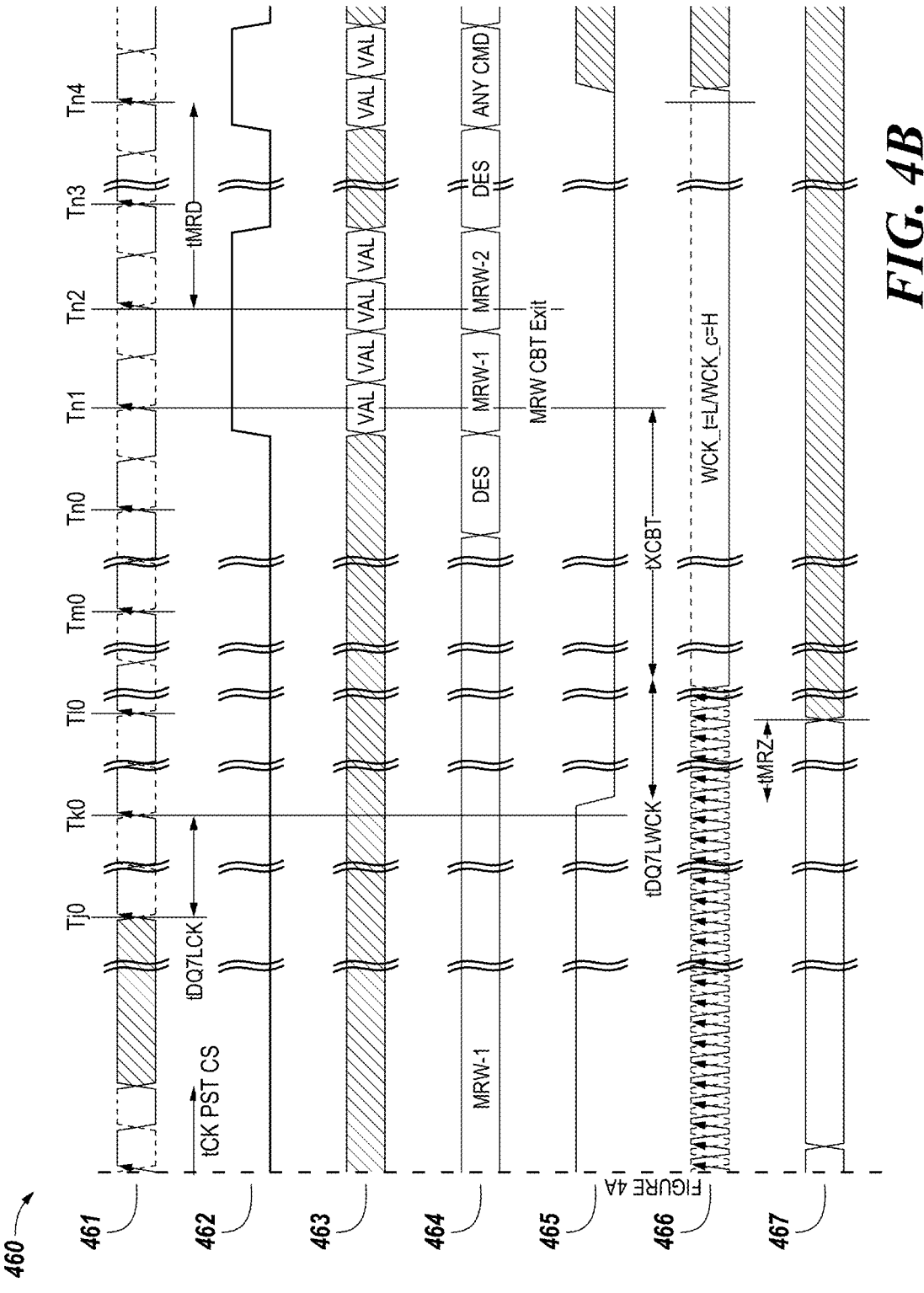

The bus training illustrated by the flow diagram 350 corresponds to a CBT mode 1 (whose timing diagram is illustrated in FIGS. 4A and 4B), in which a test pattern is transferred to a memory device (e.g., the memory device 216 illustrated in FIGS. 2A and 2B) via the CA bus 222, the test pattern is asynchronously read from the memory device, and a determination is made as to whether the two (e.g., test patterns) match.

At 351, a memory device (e.g., the memory device 216 illustrated in FIGS. 2A and 2B) is started (e.g., powered up or put in an active state). As illustrated in FIGS. 2A and 2B, memory device 216 can include memory dice 220 that are linked together (referred to as linked memory dice 220) as via wire links 226, for example. At 352, memory device 216 is initialized by determining a sequence at which memory dice 220 are accessed to randomize data transfers within (e.g., memory dice of) a rank or ranks. As described in connection with FIGS. 2A and 2B, the PRBS generators 232 in conjunction with the IDs 234 respectively assigned to the memory dice 220 can determine the sequence. At 353 and 354, data are read from the CA pad 221 and transferred to a sub-pad (e.g., sub-pad 227) of the selected memory die 220 via the CA bus 222.

At 355, a determination is made as to whether the selected memory die is a primary memory die or a secondary memory die. If the selected memory die 220 corresponds to a secondary memory die (e.g., the memory die 220-2, 220-3, or 220-4), the flow diagram 350 proceeds to 356, at which data are ultimately transferred to a sub-pad (e.g., sub-pad 227-1) of a primary memory die (e.g., the memory die 220-1) via one or more wire links (e.g., wire links 226). For example, if the selected memory die corresponds to the memory die 220-2, the data are transferred from the sub-pad 227-2 to the sub-pad 227-1 via the wire link 226-1. In another example, if the selected memory die corresponds to the memory die 220-4, the data are transferred from the sub-pad 227-4 to the sub-pad 227-3 of the memory die 220-3 via the wire link 226-3, then from the sub-pad 227-3 to the sub-pad 227-2 of the memory die 220-2 via the wire link 226-2, and then from the sub-pad 227-2 to the sub-pad 227-1 of the memory die 220-1 via the wire link 226-1.

If the selected memory die 220 does not correspond to a secondary memory die, but to a primary memory die (e.g., the memory die 220-1), the flow diagram 350 proceeds directly to 357. At 357, data are transferred from the sub-pad to the main pad (e.g., main pad 229-1) of the primary memory die. At 358, data are transferred out of the memory device (e.g., the memory die 220-1) via an external data bus 236.

FIGS. 4A and 4B illustrate a timing diagram 460 for accessing one of linked memory dice during an example bus training in accordance with a number of embodiments of the present disclosure. The timing diagram 460 illustrates signals sent (e.g., transmitted) on a clock signal ("CK_t" and "CK_c" illustrated in FIGS. 4A and 4B) bus (e.g., the clock signal bus 215 illustrated in FIGS. 2A and 2B), a chip select (CS) bus (e.g., the CS bus 219 illustrated in FIGS. 2A and 2B), and a CA bus (e.g., the CA bus 222 illustrated in FIGS. 2A and 2B).

The timing diagram 460 further illustrates a command indication row 464 ("Command" shown in FIGS. 4A and 4B), the DQ[7] 465 signal under the control of a memory controller, and the DQ[6:0] signal 467 under the control of the memory device. For example, the DQ[6:0] signal 467 represents a signal indicative of data being sent on an external data bus, such as an external data bus 236 illustrated in FIGS. 2A and 2B. For example, a WCK signal 466 illustrated in FIGS. 4A and 4B represents a write clock signal, which can be also referred to as a read clock signal and/or a read/write clock signal. Further, after DQ[7] signal 465 is driven high, the test pattern "A" 468 or "B" 469 on a CA bus (e.g., the CA bus 222 illustrated in FIGS. 2A and 2B) can be captured by a DQ bus (e.g., the DQ bus 236 illustrated in FIGS. 2A and 2B) to start the CBT.

A bus training operation (e.g., a CBT procedure) can be entered ("MRW CBT Entry" as shown in FIGS. 4A and 4B) by issuing mode register write command 1 ("MRW-1" shown in FIGS. 4A and 4B) and mode register write command 2 ("MRW-2" shown in FIGS. 4A and 4B) in the command signal indicated by the command indication row 464. The timing diagram 460 also illustrates the driving high of the DQ[7] bits (e.g., by the controller) responsive to the mode register write commands being issued.

At 468 shown in FIG. 4A, the memory controller transmits a pattern "A" to the memory device over the CA bus. Further, at 469 shown in FIG. 4A, the memory controller transmits a pattern "B" to the memory device over the CA bus. While test patterns "A" 468 and "B" 469 can be transmitted to each memory die (e.g., memory die 220, 720, 820), a test pattern "B" can function as a back-up test pattern in the event that the bus training was successful with the test pattern "A". The pattern "A" can be returned by and/or via a memory die (e.g., a primary memory die 720-1-1 illustrated in FIG. 7) via the DQ[6:0] bus at 1010 and the pattern "B" can be returned by and/or via a memory die (e.g., a primary memory die 720-2-1 illustrated in FIG. 7) via the DQ[6:0] bus. A DQ[7] 465 is further driven low to allow two time periods tDQ7LWCK and tXCBT shown in FIG. 4B, the memory controller issues the mode register writes commands 1 and 2 ("MRW1" and "MRW2" as shown in FIGS. 4A and 4B) to exit the bus training operation ("MRW CBT Exit" as shown in FIGS. 4A and 4B).

Figure 5:
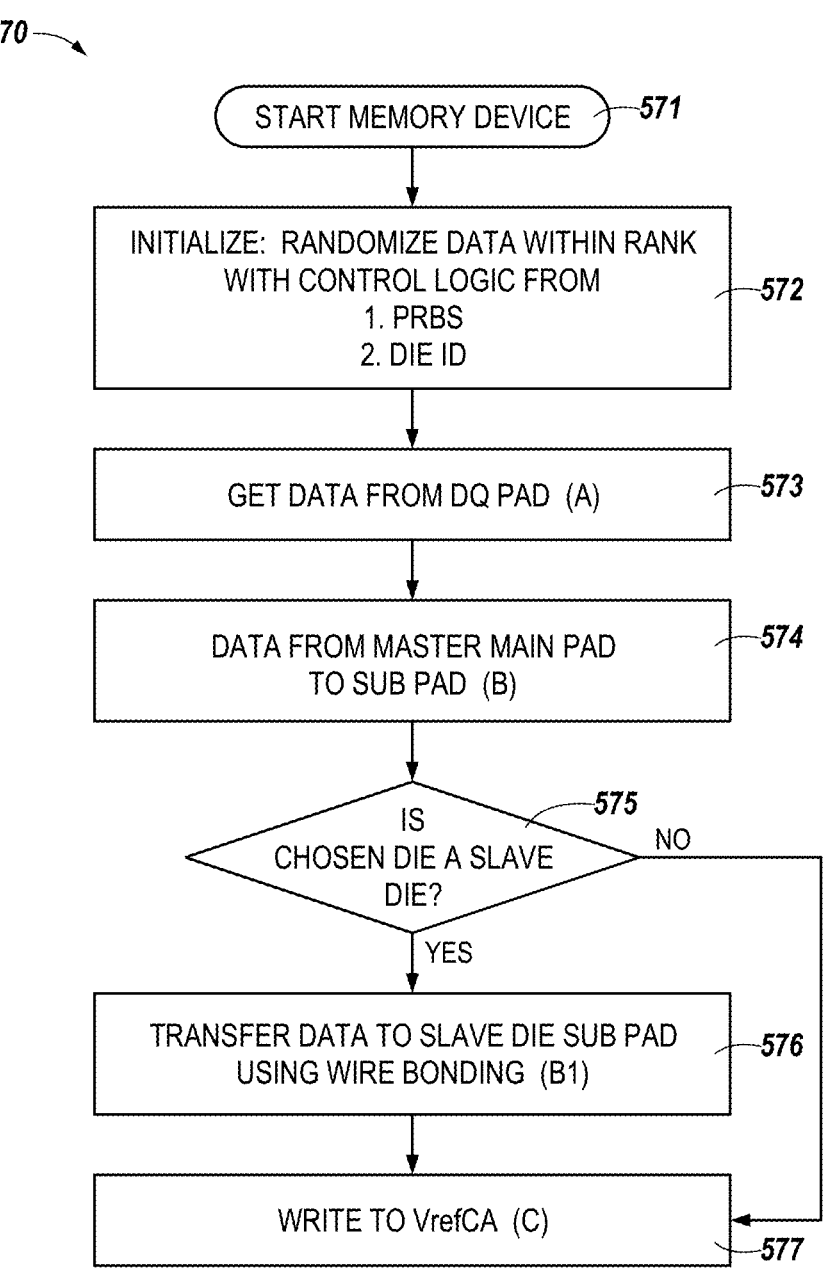
FIG. 5 is a flow diagram that illustrates accessing one of a set of linked memory dice during a bus training in accordance with a number of embodiments of the present disclosure.

FIG. 5 is another flow diagram 570 that illustrates accessing one of linked memory dice (e.g., the memory dice 220 illustrated in FIGS. 2A and 2B) during a bus training (e.g., the bus training illustrated in connection with FIGS. 6A and 6B) in accordance with a number of embodiments of the present disclosure. The bus training illustrated by the flow diagram 350 corresponds to a CBT mode 2 (whose timing diagram is illustrated in FIGS. 6A and 6B), in which data indicative of one or more signals for setting a reference voltage level of a CA bus (alternatively referred to as "Vref (CA)") are sent to the memory device (e.g., the memory device 216 illustrated in FIGS. 2A and 2B) prior to the memory device receiving test patterns "A" and "B".

At 571, a memory device (e.g., the memory device 216 illustrated in FIGS. 2A and 2B) is started (e.g., powered up). As illustrated in FIGS. 2A and 2B, memory device 216 can include memory dice 220 that are linked together (referred to as linked memory dice 220) as via wire links 226, for example. At 572, memory device 216 is initialized by determining a sequence at which memory dice 220 are accessed to randomize data transfers within (e.g., memory dice of) a rank or ranks. As described in connection with FIGS. 2A and 2B, the PRBS generators 232 in conjunction with the IDs 234 respectively assigned to the memory dice 220 can determine the sequence. At 573 and 574, data (e.g., for setting Vref (CA)) are read from the DQ pad 238 and transferred (e.g., sent) to a sub-pad (e.g., sub-pad 227) of the primary memory die 220-1 via the external data bus 236.

At 575, a determination is made as to whether the selected memory die is a primary memory die or a secondary memory die. If the selected memory die 220 corresponds to a secondary memory die (e.g., the memory die 220-2, 220-3, or 220-4), the flow diagram 570 proceeds to 576, at which data are ultimately transferred to a sub-pad (e.g., sub-pad 227-1) of the selected secondary memory die via one or more wire links (e.g., wire links 226). For example, if the selected memory die corresponds to memory die 220-2, the data are transferred from the sub-pad 227-1 to the sub-pad 227-2 via the wire link 226-1. In another example, if the selected memory die corresponds to the memory die 220-4, the data are transferred from the sub-pad 227-1 to the sub-pad 227-2 via the wire link 226-1, then from the sub-pad 227-2 to the sub-pad 227-3 via the wire link 226-2, and then from the sub-pad 227-3 to the sub-pad 227-4 via the wire link 226-3. At 577, once the data are transferred to the selected secondary memory die, the data are written to the selected secondary memory die If the selected memory die 220 does not correspond to a secondary memory die, but to a primary memory die (e.g., the memory die 220-1), the flow diagram 570 proceeds directly to 577. At 577, data for setting Vref (CA) can be written to the primary memory die 220-1.

Figure 6A:
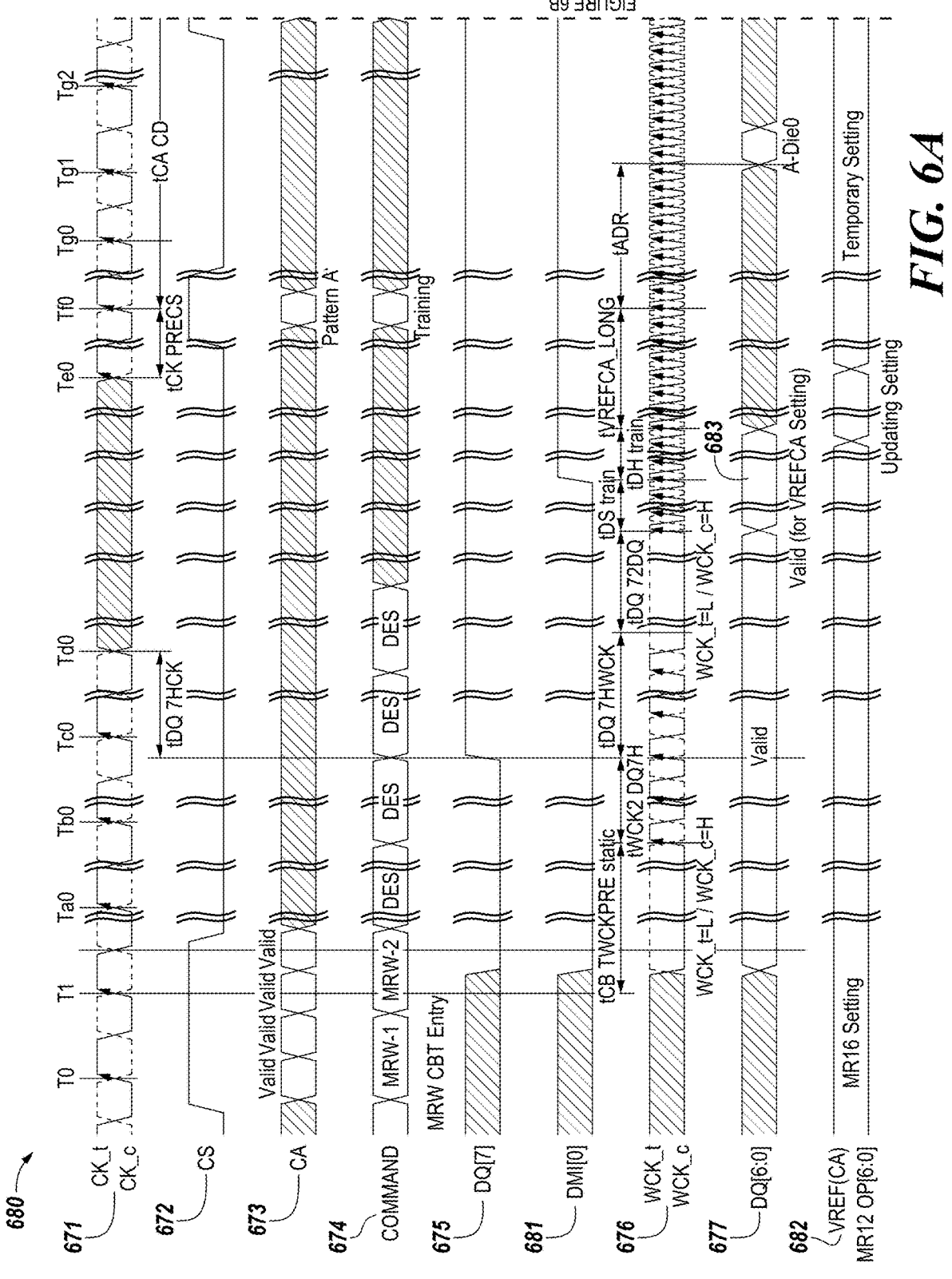
FIGS. 6A and 6B illustrate a timing diagram for accessing one of a set of linked memory dice during another example bus training in accordance with a number of embodiments of the present disclosure.
Figure 6B:
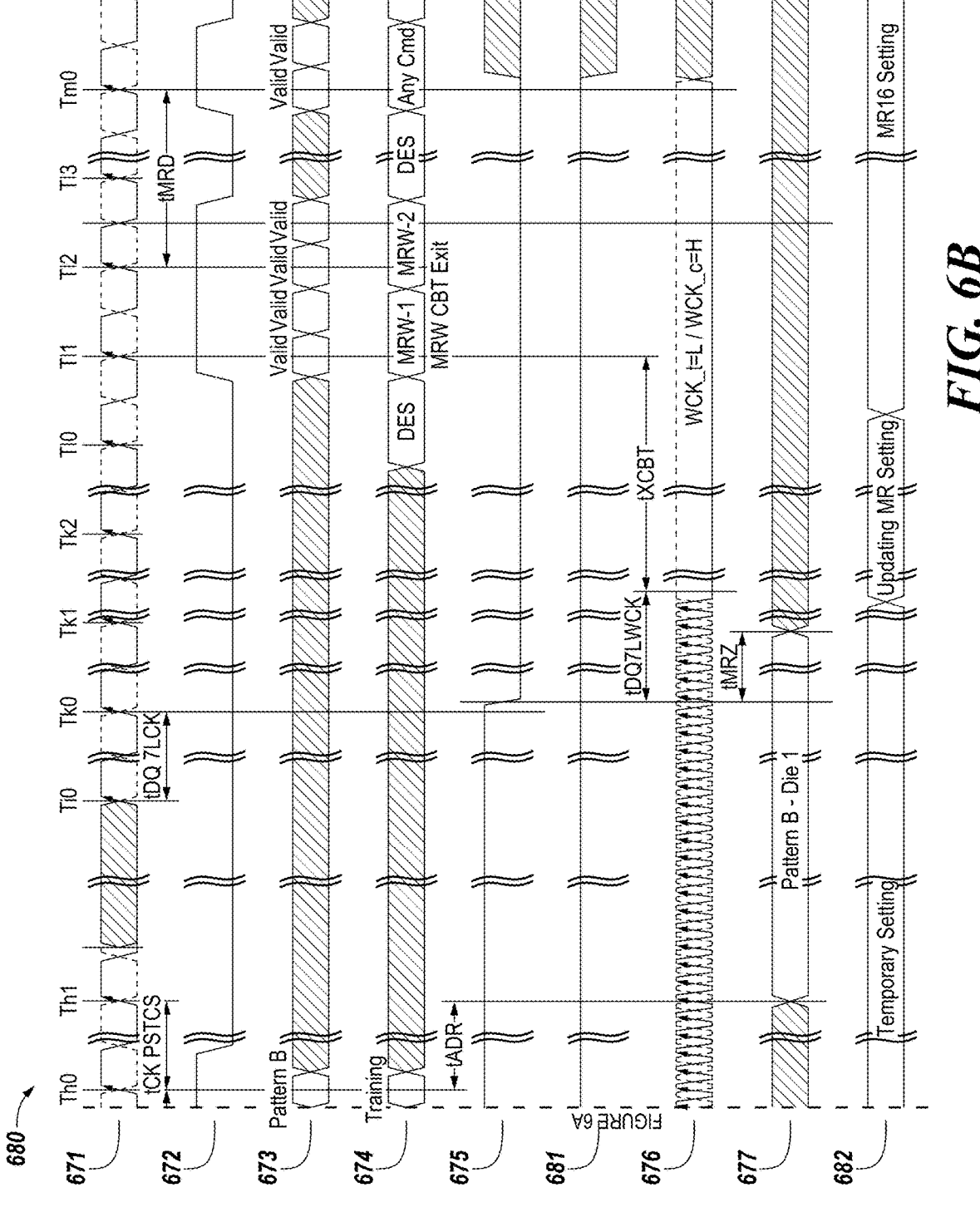

FIGS. 6A and 6B illustrates a timing diagram for accessing one of linked memory dice during another example bus training in accordance with a number of embodiments of the present disclosure. In addition to those signals illustrated in FIGS. 4A and 4B, FIGS. 6A and 6B further illustrate a DMI[0] signal (that can be sent on a bus coupled to a DMI pin) and a Vref (CA) signal that can be sent on an external data bus (e.g., the external data bus 236 illustrated in FIGS. 2A and 2B and coupled to 6 DQ pins configured to receive "DQ[6:0]" signals shown in FIGS. 6A and 6B). As used herein, a pin that is used to send (e.g., transmit) the DMI[0] signal can be referred to as a "DMI[0] pin". Further, as used herein, one or more pins that are used to send (e.g., transmit) the DMI[6:0] signals can be referred to as DMI[6:0] pins.

The bus training operation illustrated in FIGS. 6A and 6B is generally analogous to the procedure illustrated in FIGS. 4A and 4B except that input signals are received (e.g., prior to receiving test patterns "A" and/or "B") at the memory device via the DQ[6:0] bus (as indicated at 683 shown in FIG. 6A) for setting Vref (CA) level during tDStrain and tDHtrain period.

A DMI[0] pin can be used as a strobe pin for Vref (CA) setting update via DQ[6:0] pins and also used as a DQ[6:0] output-mode-off switch. When the HIGH level of DMI[0] signal is sampled by WCK, DQ[6:0] levels can be sampled by a rising edge of the DMI[0] signal and updates Vref (CA) setting. When the LOW level of DMI[0] signal is sampled by the WCK signal 666, DQ[6:0] output mode (e.g., in which DQ[6:0] pins are used as output pins to send signals to the controller 106 illustrated in FIG. 1) is turned-off and changes to input mode (e.g., in which DQ[6:0] pins are used as input pins to receive signals from the controller 106, for example). The DMI[0] signal can be maintained "HIGH" until particular patterns driven by DQ[6:0] signals are completely latched.

After tDQ72DQ, the memory die (e.g., the memory die 220 illustrated in FIGS. 2A and 2B) can accept alteration of its Vref (CA) value using the DQ[6:0] and DMI[0] signals, being sampled by the WCK signal 666 from the value set by MR12 OP[6:0].

It can be ensured that the update Vref (CA) value is "settled" at least for a period of time "tVref_LONG" shown in FIGS. 6A and 6B prior to attempting to latch CA information. To verify that the receiver has the correct Vref (CA) setting and to further train the CA eye relative to clock (CK), values (e.g., test patterns "A" and "B") latched at the receiver on the CA bus can be asynchronously output to the DQ bus. Analogously as described in connection with FIGS. 4A and 4B, the memory controller issues the mode register writes commands 1 and 2 ("MRW1" and "MRW2" as shown in FIGS. 4A and 4B) after expiration of two time periods (tDQ7LWCK and tXCBT subsequent to DQ[7] 675 being driven low) to exit the bus training operation ("MRW CBT Exit" as shown in FIGS. 4A and 4B).

Figure 7:
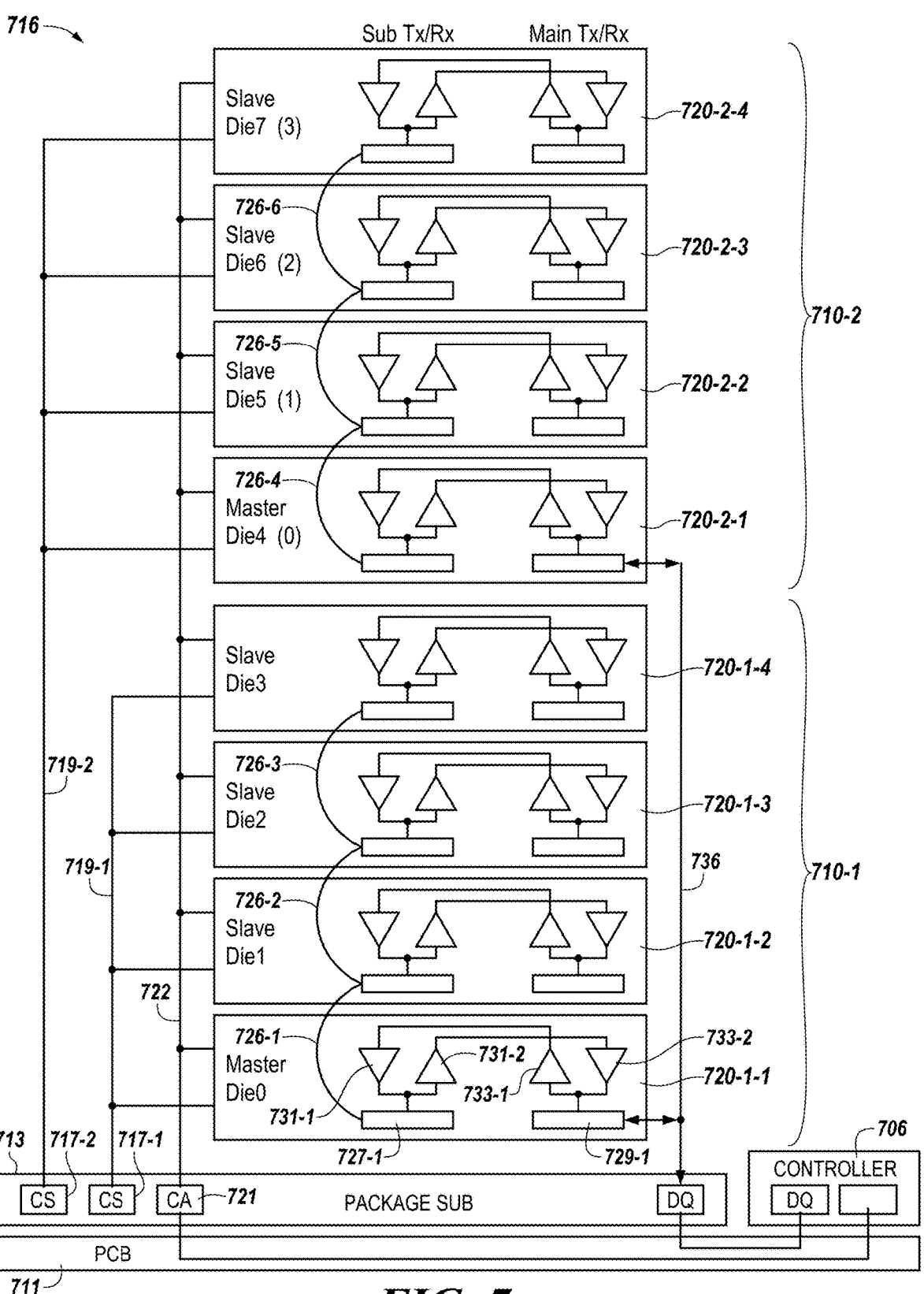
FIG. 7 is a block diagram of an example stacked memory device architecture in accordance with a number of embodiments of the present disclosure.

FIG. 7 is a block diagram of an example memory device 716 architecture in accordance with a number of embodiments of the present disclosure. As illustrated in FIG. 7, the memory device 716 and a controller 706 (which is analogous to the controller 106 illustrated in FIG. 1) are built on a substrate 711.

As illustrated in FIG. 7, memory device 716 includes two ranks 710-1 and 710-2 of memory dice. For example, the memory device 716 includes a first rank 710-1 including memory dice 720-1-1, . . . , 720-1-4 (collectively referred to as memory dice 720-1) and a second rank 710-2 including memory dice 720-2-1, . . . , 720-2-4 (collectively referred to as memory dice 720-2). Embodiments are not limited to a particular quantity of memory dice/ranks a memory device (e.g., the memory device 716) includes. As used herein, the term "ranks" generally refers to a plurality of memory chips (e.g., DRAM memory dice and/or FeRAM memory dice) that can be accessed simultaneously.

Memory dice 720-1 and 720-2 can be analogous to memory dice 220 illustrated in FIGS. 2A and 2B. For example, each memory die 720 includes a pair of transmitter/receiver 731 (e.g., "Tx" and "Rx" illustrated in FIG. 7) coupled to a respective sub-pad 727 and another pair of transmitter/receiver 733 coupled to a respective main pad 729. For example, As illustrated in FIG. 7, the first rank 710-1 is coupled to a package substrate 713 via a chip select (CS) bus 719-1

(e.g., "CS0" coupled to a CS pad 717-1), while the second rank 710-2 is coupled to the package substrate via a CS bus 719-2 (e.g., "CS1" coupled to a CS pad 717-2). Since memory dice 720 of each rank 710 are coupled to and selected via a same CS signal (e.g., sent via a respective CS bus 719), memory dice of each rank may not be individually visible to the controller 706.

Both ranks 710-1 and 710-2 are coupled to the package substrate 713 via a same CA bus 722 (e.g., coupled to a CA pad 721) and an external data bus 736 (e.g., coupled to a DQ pad 738). The CA pad 721 and DQ pad 738 are further coupled to the controller 706.

Since the external data bus 736 is shared by both primary memory dice 720-1-1 and 720-2-1, a sequence in which data are sent from the primary memory dice 720-1-1 and 720-2-1 can be also (e.g., randomly) determined (e.g., using one or more bit sequence generators 232 illustrated in FIGS. 2A and 2B on the primary memory dice 720-1-1 and 720-2-1). For example, a bus training (e.g., CBT) operation performed on the memory dice 720-1 and 720-2 can include sending a test pattern (e.g., 7 bits) to each memory dice (e.g., of the memory dice 720-1-1, . . . , 720-1-4 and 720-2-1, . . . , 720-1-4) via the CA bus 722. The test pattern (e.g., received via the CA bus 722) can be sent from each memory dice 720 to the primary memory die 720-1 or the primary memory die 720-2 to be ultimately sent on the external data bus 736 (e.g., 7-bit wide). The bit sequence generators 232 (e.g., of the primary memory dice 720-1-1 and 720-2-1) can determine a sequence, in which the primary memory dice 720-1-1 and 720-2-1 send the test pattern on the external data bus 736 and select one of the primary memory dice 720-1-1 and 720-2-1 based on the sequence. More specifically, the bit sequence generators 232 can select the primary memory die 720-1-1 to send the test pattern on the external data bus 736 prior to the primary memory die 720-2-1, which can be subsequently selected to send the test pattern on the external data bus 736.

Figure 8:
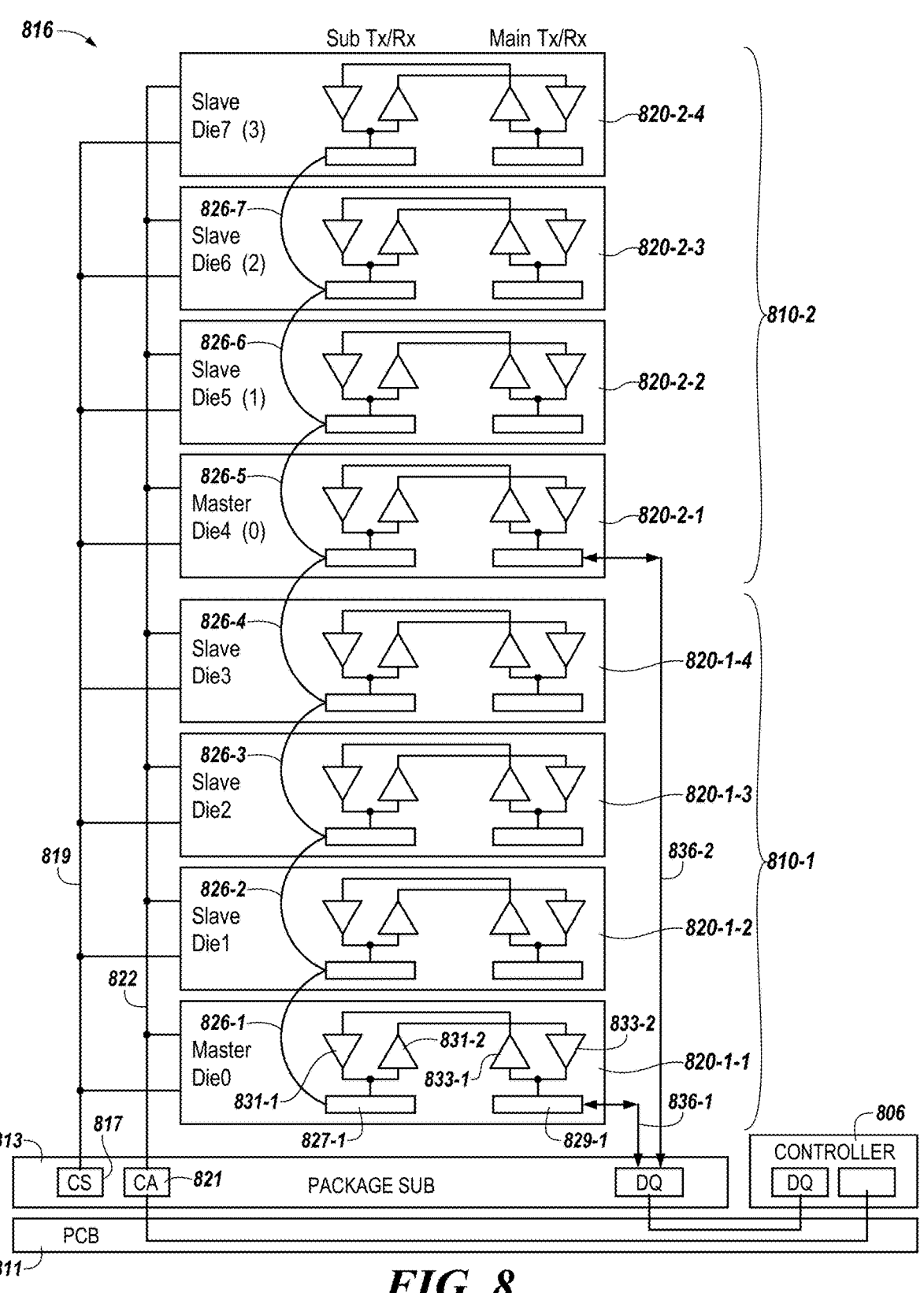
FIG. 8 is a block diagram of another example stacked memory device architecture in accordance with a number of embodiments of the present disclosure.

FIG. 8 is a block diagram of another example memory device 816 architecture in accordance with a number of embodiments of the present disclosure. As illustrated in FIG. 8, memory device 816 and a controller 806 (which is analogous to the controller 106 illustrated in FIG. 1) are built on a substrate 811.

As illustrated in FIG. 8, memory device 816 includes two ranks of memory dice. For example, the memory device 816 includes a first rank 810-1 including memory dice 820-1-1, . . . , 820-1-4 (collectively referred to as memory dice 820-1) and a second rank 810-2 including memory dice 820-2-1, . . . , 820-2-4 (collectively referred to as memory dice 820-2). Memory dice 820-1 and 820-2 can be analogous to memory dice 220 illustrated in FIGS. 2A and 2B, for example. Embodiments are not limited to a particular quantity of memory dice/ranks a memory device (e.g., the memory device 816) includes.

Memory device architecture illustrated in FIG. 8 is generally analogous to the memory device architecture illustrated in FIG. 7 except that both ranks 810-1 and 810-2 are coupled to a same CS bus 819 and two primary memory dice 820-1-1 and 820-2-1 are coupled to a DQ pad 838 respectively via different external data buses 836-1 and 836-2. The CA pad 821 and DQ pad 838 are further coupled to the controller 806. Since memory dice 820 of both ranks 810-1 and 810-2 are coupled to and selected via a same CS signal (e.g., sent via a respective CS bus 719), memory dice of both ranks 810-1 and 810-2 may not be individually visible to the controller 806.

As illustrated in FIG. 8, two ranks 810-1 and 810-2 are connected by an wire link 826-4, which is connected between sub-pads 821-1-1 (of the primary memory die 820-1-1) and 821-2-1 (of the primary memory die 820-2-1). This allows data to be transferred between memory dice 820-1-1, . . . , 820-1-4 and 820-2-1, . . . , 820-2-4. Thus, data from a memory die 820 can be sent on either or both of the external data buses 836-1 and 836-2 in a split manner.

This capability, which is provided by the wire link 826-4, eliminates the need for each external data bus to be as wide as the data received from the CA bus 822. For example, when 7 bits of a test pattern is received via the CA bus 822 during a bus training (e.g., CBT) procedure, the 7 bits can be sent (e.g., to the DQ pad 838) from one of the memory dice 820 on two respective external data buses 836-1 and 836-2 with each external data bus 836 being a 4-bit wide in a split manner. For example, three bits of the test pattern can be sent on the external data bus 836-1, while the remaining four bits can be sent on the external data bus 836-2 without requiring the external data buses to be at least seven bits wide.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
determining a sequence at which a set of memory dice that are linked together are accessed, wherein each memory die of the set of memory dice comprises a respective command/address (CA) signal receiver that is directly coupled to a CA bus, the set of memory dice further including:
    a primary memory die coupled to an external data bus; and
    a number of secondary memory dice coupled to the primary memory die respectively via a number of wire links; and
accessing the set of memory dice one at a time in the determined sequence by:

receiving, at a respective memory die of the set of memory dice, first data corresponding to a test data pattern at the CA signal receiver directly from the CA bus; and
    sending the first data from respective memory dice of the set of memory dice in the determined sequence on the external data bus.

2. The method of claim 1, wherein accessing the set of memory dice one at a time in the determined sequence includes sending signals indicative of data respectively from the number of memory dice in the determined sequence by:
    sending data from each secondary memory die of the number of secondary memory dice to the primary memory die to further transfer the data from the primary memory die via the external data bus; and
    sending data from the primary memory die via the external data bus.

3. The method of claim 1, further comprising:
receiving, at the set of memory dice and prior to receiving the first data, one or more signals indicative of second data for setting a reference voltage level of the CA bus via the external data bus; and
writing the second data for setting to respective memory dice of the set.

4. An apparatus, comprising:
a set of memory dice comprising:
    a primary memory die comprising a bit sequence generator and coupled to a substrate via a first external data bus and a command/address (CA) bus; and
    a number of secondary memory dice each individually comprising:
        a respective CA signal receiver that is directly coupled to the CA bus; and
        a respective bit sequence generator and coupled to the primary memory die via a number of wire links in a cascaded manner; and
    wherein one or more of the bit sequence generator of the primary memory die and the respective bit sequence generators of the number of secondary memory dice are configured to determine a sequence in which memory dice of the first set are accessed;
    wherein the primary memory die is configured to send data from the primary memory die or data received from one of the number of secondary memory dice on the first external data bus; and
    wherein each secondary memory die of the number of secondary memory dice is configured to send data from the respective secondary memory die or a different secondary memory die to the primary memory die via one or more wire links of the number of wire links to cause the data to be sent from the primary memory die on the first external data bus.

5. The apparatus of claim 4, wherein:
the primary memory die further comprises:
    a first primary pad coupled to the external data bus; and
    a first secondary pad coupled to the first primary pad; and
each secondary memory die further comprises a second secondary pad coupled to a respective wire link of the number of wire link.

6. The apparatus of claim 5, wherein:
a respective one of the number of secondary memory dice is configured to send data to the first secondary pad of the primary memory die via one or more second secondary pads of the number of secondary memory dice; and the primary memory die is configured to send the data received at the first secondary pad to the first primary pad to further send the data on the external data bus.

7. The apparatus of claim 5, wherein:
the primary memory die is configured to:
   receive, at the first primary pad, data to be written to a respective secondary memory die of the number of secondary memory dice;
   send the data from the primary pad to the first secondary pad; and
   send the data from the first secondary pad to the respective secondary memory die via one or more second secondary pads of the number of secondary memory dice.

8. The apparatus of claim 4, wherein the bit sequence generator of the primary memory die, or one or more of the bit sequence generators of the number of secondary memory dice, or both are a pseudo random bit sequence (PRBS) generator.

9. The apparatus of claim 4, wherein the one or more bit sequence generators are configured to determine the sequence using one or more identifiers respectively assigned to memory dice of the set of memory dice.

10. An apparatus, comprising:
a first set of memory dice coupled to a substrate via a command/address (CA) bus and a first external data bus, wherein the first set of memory dice comprise:
   a first primary memory die comprising a CA signal receiver that is directly coupled to the CA bus and to the substrate via the CA bus; and
   a number of first secondary memory dice, each of the number of first secondary memory dice comprising a respective CA signal receiver that is directly coupled to the CA bus, wherein the number of first secondary memory dice further coupled to the first primary memory die via respective first wire links in a cascaded manner; and
a second set of memory dice comprising:
   a second primary memory die comprising a CA signal receiver that is directly coupled to the CA bus and to the substrate via the CA bus; and
   a number of second secondary memory dice coupled to, each of the number of second secondary memory dice comprising a respective CA signal receiver that is directly coupled to the CA bus, wherein the number of second secondary memory dice further coupled to the second primary memory die via respective second wire links in a cascaded manner; and
wherein one or more memory dice of the first set of memory dice comprises a bit sequence generator;

wherein one or more memory dice of the second set of memory dice comprises a bit sequence generator; and
wherein the bit sequence generators of the one or more memory dice of the first set of memory dice or the bit sequence generators of the one or more memory dice of the second set of memory dice, or both, are configured to determine a sequence in which respective memory dice of the first set of memory dice or the second set of memory dice, or both, are accessed.

11. The apparatus of claim 10, wherein:
the first set of memory dice is coupled to the substrate via a first chip select (CS) bus; and
the second set of memory dice is coupled to the substrate via a second CS bus.

12. The apparatus of claim 11, wherein the bit sequence generators are configured to determine the sequence in which the first set of memory dice and the second set of memory dice are accessed.

13. The apparatus of claim 10, wherein the first set of memory dice and the second set of memory dice are coupled to a same chip select (CS) bus.

14. The apparatus of claim 10, wherein:
the second set of memory dice is further coupled to the substrate via the first external data bus; and
a size of the first external data bus is at least a size of the CA bus.

15. The apparatus of claim 10, wherein the second set of memory dice is further coupled to the substrate via a second external data bus.

16. The apparatus of claim 15, wherein a size of the first external data bus or the second external data bus is less than a size of the CA bus.

17. The apparatus of claim 15, wherein the first set of memory dice and the second set of memory dice are coupled to one another via a third wire link.

18. The apparatus of claim 15, wherein the bit sequence generators are configured to determine a sequence in which the first primary memory die and the second primary memory die are accessed.

19. The apparatus of claim 15, wherein a respective memory die of the first and second sets of memory dice is configured to:
   send a first portion of data to the first primary memory die to further cause the first primary memory die to send the first portion on the first external data bus; and
   send a second portion of data to the second primary memory die to further cause the second primary memory die to send the second portion on the second external data bus.

* * * * *